United States Patent
Ko et al.

(10) Patent No.: US 9,231,164 B2
(45) Date of Patent: Jan. 5, 2016

(54) LIGHT-EMITTING DEVICE

(71) Applicant: EPISTAR CORPORATION, Hsinchu (TW)

(72) Inventors: Ting-Chia Ko, Hsinchu (TW); De-Shan Kuo, Hsinchu (TW); Chun-Hsiang Tu, Hsinchu (TW); Po-Shun Chiu, Hsinchu (TW); Chien-Kai Chung, Hsinchu (TW); Hui-Chun Yeh, Hsinchu (TW); Min-Yen Tsai, Hsinchu (TW); Tsun-Kai Ko, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/861,449

(22) Filed: Apr. 12, 2013

(65) Prior Publication Data

US 2014/0124819 A1     May 8, 2014

Related U.S. Application Data

(60) Provisional application No. 61/721,737, filed on Nov. 2, 2012.

(51) Int. Cl.
*H01L 33/00* (2010.01)
*H01L 33/42* (2010.01)
*H01L 33/22* (2010.01)
*H01L 33/40* (2010.01)

(52) U.S. Cl.
CPC .............. *H01L 33/42* (2013.01); *H01L 33/405* (2013.01); *H01L 33/0095* (2013.01); *H01L 33/22* (2013.01); *H01L 33/40* (2013.01)

(58) Field of Classification Search
CPC ... H01L 33/42; H01L 33/405; H01L 33/0095; H01L 33/40
USPC ............. 257/13, 14, 79, 81, 98, 99, 101, 103, 257/734, 745, 749, E33.023, E33.025, 257/E33.028, E33.034, E33.043
See application file for complete search history.

(56) References Cited

U.S. PATENT DOCUMENTS

| | | | |
|---|---|---|---|
| 2010/0123166 A1* | 5/2010 | Bae ................................ 257/103 |
| 2010/0190298 A1* | 7/2010 | Kuramoto et al. ............. 438/121 |
| 2010/0272142 A1* | 10/2010 | Fukuda ........................ 372/45.01 |
| 2011/0086448 A1* | 4/2011 | Seong et al. ..................... 438/27 |
| 2012/0273751 A1* | 11/2012 | Chang et al. .................... 257/13 |

OTHER PUBLICATIONS

Gregory et al. Fabrication of High-Conductivity, Transparent Electrodes with Trenched Metal Bus Lines. J. electrochem. Soc., vol. 138, No. 7, Jul. 1991, pp. 2070-2075.*
MIT 3.091. Introduction to Solid State Chemistry, Lecture 9, 2004, pp. 1-14.*

(Continued)

*Primary Examiner* — Galina Yushina
(74) *Attorney, Agent, or Firm* — Patterson & Sheridan, L.L.P.

(57) ABSTRACT

A light-emitting device comprises a first semiconductor layer; and a transparent conductive oxide layer comprising a diffusion region having a first metal material and a non-diffusion region devoid of the first metal material, wherein the non-diffusion region is closer to the first semiconductor layer than the diffusion region.

6 Claims, 5 Drawing Sheets

(56) References Cited

OTHER PUBLICATIONS

MSE Introduction to Engineering Materials, Chapter 6: Diffusion in Solids. 2006, pp. 1-11.*

Gregory, Fabrication of High-Conductivity, Transparent Electrode with Trenched Metal Bus Lines. The University of Rhode Island, 1991, pp. 2070-2075.*

* cited by examiner

LIGHT-EMITTING DEVICE

REFERENCE TO RELATED APPLICATION

This application claims the right of priority based on U.S. provisional application Ser. No. 61/721,737, filed on Nov. 2, 2012, and the contents of which are hereby incorporated by reference in its entirety.

TECHNICAL FIELD

The application relates to a light-emitting device, and more particularly, to a light-emitting device having a transparent conductive oxide layer with a diffusion region and a non-diffusion region.

DESCRIPTION OF BACKGROUND ART

The light-emitting diode (LED) is a solid state semiconductor device. A structure of the light-emitting diode (LED) comprises a p-type semiconductor layer, an n-type semiconductor layer, and a light-emitting layer. The light-emitting layer is formed between the p-type semiconductor layer and the n-type semiconductor layer. The structure of the LED generally comprises group III-V group compound semiconductor such as gallium phosphide, gallium arsenide, or gallium nitride. The light-emitting principle of the LED is the transformation of electrical energy to optical energy by applying electrical current to the p-n junction to generate electrons and holes. Then, the LED emits light when the electrons and the holes combine.

SUMMARY OF THE APPLICATION

A manufacturing method of a light-emitting device comprises providing a first semiconductor layer; forming a transparent conductive oxide layer on the first semiconductor layer; forming a metal layer comprising a first metal material on a surface of the transparent conductive oxide layer; heat treating the transparent conductive oxide layer and the metal layer thereby forming a diffusion region comprising the first metal material and a non-diffusion region substantially not comprising the first metal material in the transparent conductive oxide layer, wherein the non-diffusion region is closer to the first semiconductor layer than the diffusion region; and forming an electrode on the transparent conductive oxide layer.

A light-emitting device comprises a first semiconductor layer; and a transparent conductive oxide layer comprising a diffusion region having a first metal material and a non-diffusion region devoid of the first metal material, wherein the non-diffusion region is closer to the first semiconductor layer than the diffusion region.

DETAILED DESCRIPTION OF PREFERRED EMBODIMENTS

Figure 1A:
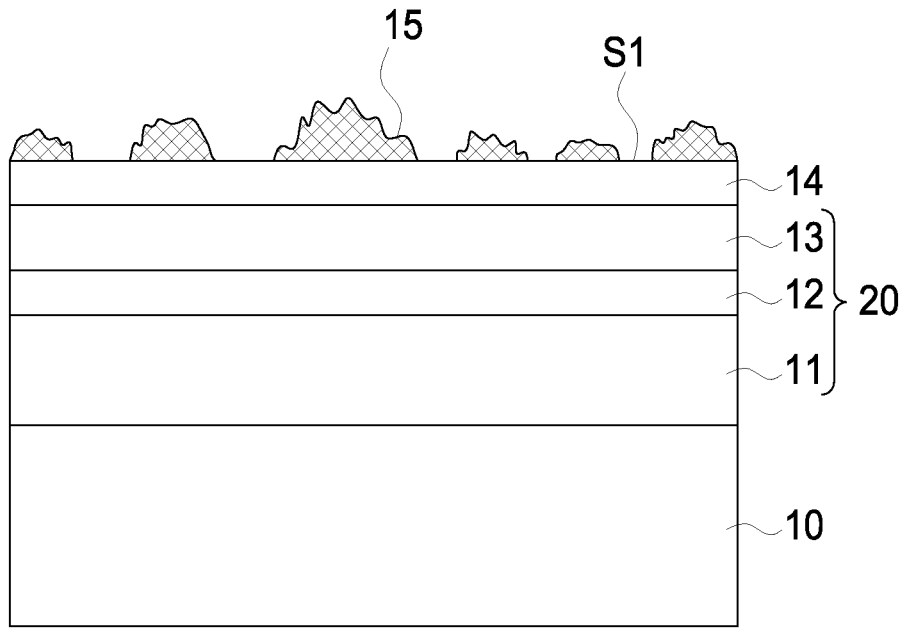
FIGS. 1A-1C illustrate a manufacturing method of a light-emitting device in accordance with one embodiment of the present application.

The embodiment of the application is illustrated in detail, and is plotted in the drawings. The same or the similar part is illustrated in the drawings and the specification with the same number.

Figure 1B:
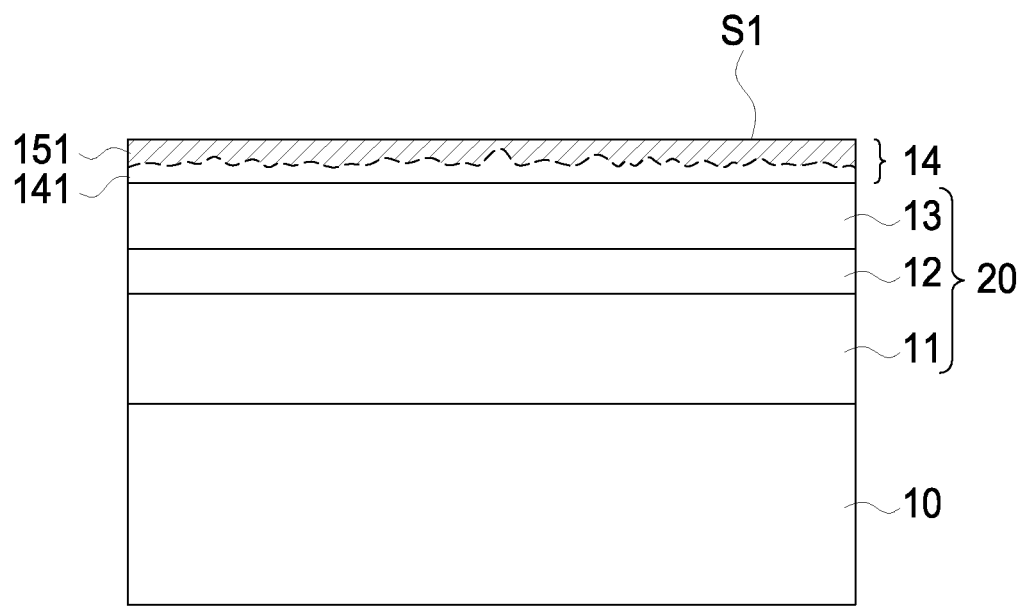
Figure 1C:
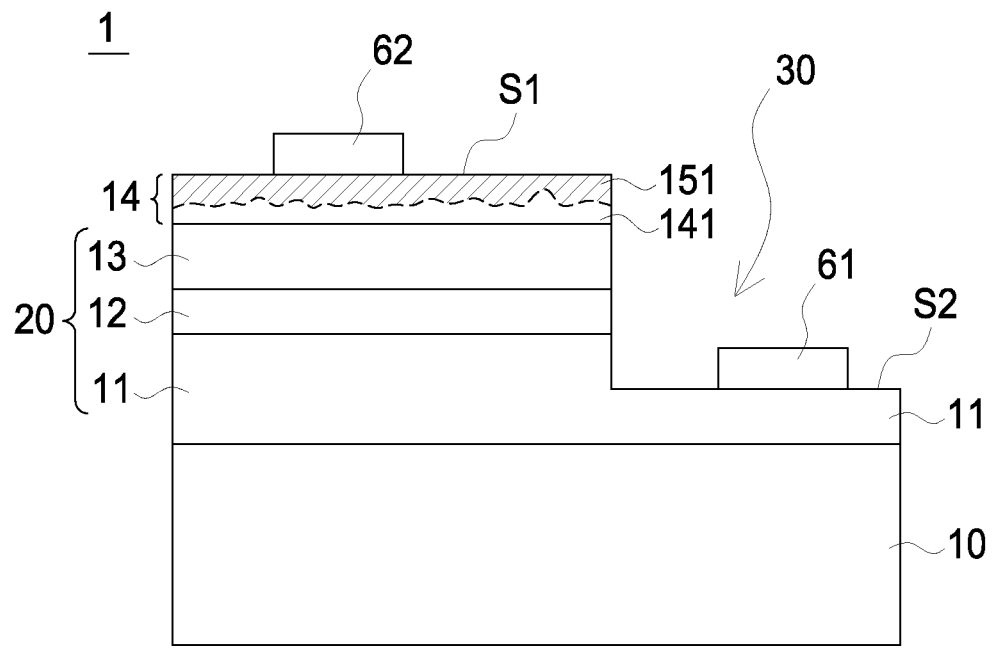

FIG. 1A to FIG. 1C illustrate a manufacturing method of first embodiment of a light-emitting device 1 in accordance with the present disclosure. The manufacturing method comprises the following steps:

Step 1:

A substrate 10, such as sapphire, is provided. A semiconductor stack 20 comprising a first semiconductor layer 13 having a first polarity, a second semiconductor layer 11 having a second polarity, and an active layer 12 is formed on the substrate 10. The active layer 12 having a structure, such as InGaN-based multiple-quantum-well (MQW) structure is formed between the first semiconductor layer 13 and the second semiconductor layer 11.

In an example of the embodiment, the first semiconductor layer 13 can be an n-type GaN layer, the second semiconductor layer 11 can be a p-type GaN layer.

The first semiconductor layer 13, the second semiconductor layer 11, or the active layer 12 may be formed by a known epitaxy method such as metallic-organic chemical vapor deposition (MOCVD) method, a molecular beam epitaxy (MBE) method, or a hydride vapor phase epitaxy (HVPE) method.

Step 2:

In step 2, a transparent conductive oxide layer 14 is formed on the semiconductor stack 20.

Next, after the transparent conductive oxide layer 14 is formed on the semiconductor stack 20, a metal layer 15 is formed on a top surface S1 of the transparent conductive oxide layer 14.

The metal layer 15 comprises a first metal material which can include an element selected from a group consisting of IIA group and IIIA group. The metal layer 15 is formed with a predetermined thickness, such as smaller than 500 angstroms, by evaporation deposition method under chamber conditions of around room temperature, and a pressure between $1 \times 10^{-5}$ Torr and $1 \times 10^{-7}$ Torr, or preferably around $2.9 \times 10^{-6}$ Torr.

The transparent conductive oxide layer 14 comprises a second metal material which can include one or more elements selected from transition metal, group IIIA or group IVA, such as indium tin oxide (ITO). The transparent conductive oxide layer 14 is formed with a predetermined thickness, such as smaller than 3000 angstroms, by evaporation deposition method under chamber conditions of around room temperature, $N_2$ ambient environment, and a pressure between $1 \times 10^{-4}$ Torr and $1 \times 10^{-2}$ Torr, or preferably around $5 \times 10^{-3}$ Torr.

The first metal material of the metal layer 15 is different from the second metal material of the transparent conductive oxide layer 14. In an example of the embodiment, the first metal material includes aluminum (Al), the second metal material includes indium (In) and tin (Sn).

Step 3:

The transparent conductive oxide layer 14 and the metal layer 15 are heat treated at a temperature between 200° C. and 700° C., preferably around 500° C.~600° C., and at an environment substantially without oxygen, e.g. at $N_2$ environment for diffusing the first metal material of the metal layer 15 into the transparent conductive oxide layer 14 and forming a diffusion region 151 as shown in FIG. 1B, wherein the transparent conductive oxide layer 14 comprises the diffusion region 151 comprising the first metal material and a non-diffusion region 141 substantially not comprising the first metal material as shown in FIG. 1B.

Step 4

A mesa 30 is formed to expose a top surface S2 of the second semiconductor layer 11 by ICP etching as shown in FIG. 1C.

Step 5

A first electrode 61 is formed on the top surface S2 of the second semiconductor layer 11, and a second electrode 62 is formed on the top surface S1 of the transparent conductive oxide layer 14 to complete the horizontal-type light-emitting device 1 as shown in FIG. 1C.

Figure 1D:
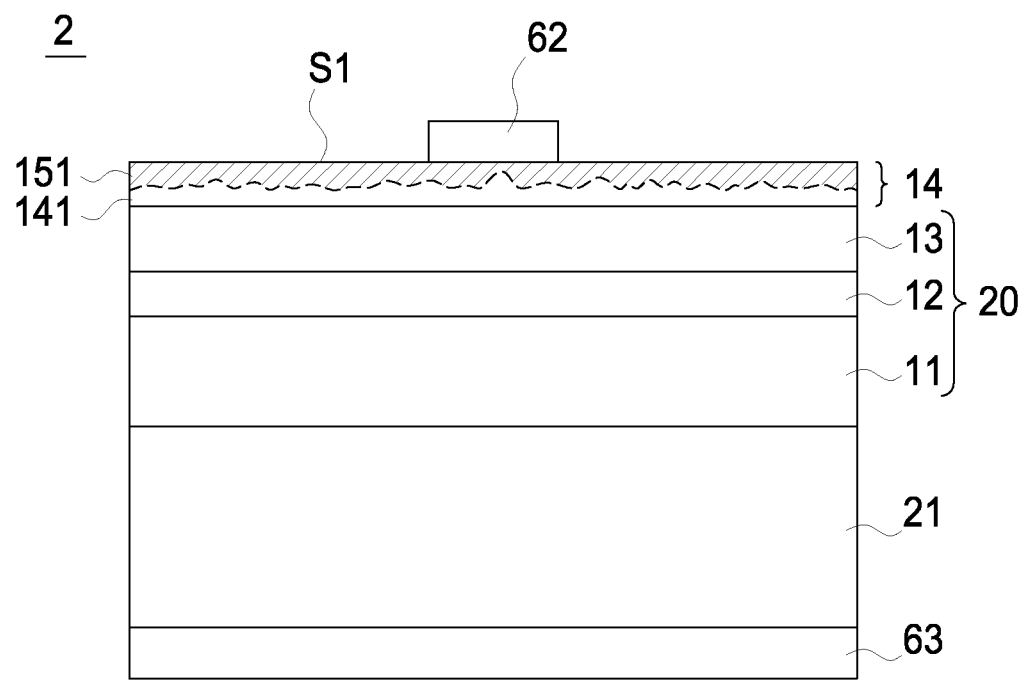
FIG. 1D illustrates a cross-sectional view of a light-emitting device in accordance with another embodiment of the present application.

The substrate 10 can be an insulating substrate, such as sapphire. Another embodiment for a vertical-type light-emitting device 2 is disclosed in FIG. 1D. The light-emitting device 2 comprises a conductive substrate 21 comprising a conductive material, such as metal or semiconductor. In the manufacturing method of the vertical-type light-emitting device 2, similar steps such as step 1 to step 3 described above can be employed, wherein the substrate 10 is replaced by the conductive substrate 21. And the step that is different from the light-emitting device 1 is by arranging a first electrode 63 and the second electrode 62 on opposite sides of a conductive substrate 21.

The material of the first semiconductor layer 13, the active layer 12 and the second semiconductor layer 11 comprise an element selected from group III-VA semiconductor such as arsenic (As), gallium (Ga), aluminum (Al), indium(In), phosphorus (P), or nitrogen (N).

The material of the transparent conductive oxide layer 14 comprises transparent conductive oxide material, such as indium tin oxide (ITO), cadmium tin oxide (CTO), antimony tin oxide, indium zinc oxide, zinc aluminum oxide, zinc oxide, or zinc tin oxide.

In accordance with the first embodiment as illustrated in FIGS. 1A-1C, the metal layer 15 is formed to be a thin layer with a thickness less than 500 angstroms before heat-treating, and is normally formed as a discontinuous layer having a plurality of metal grains individually distributed on the transparent conductive oxide layer 14. After heat-treating, the first metal material of the metal layer 15 is totally diffused into the transparent conductive oxide layer 14 to form the diffusion region 151.

Figure 2:
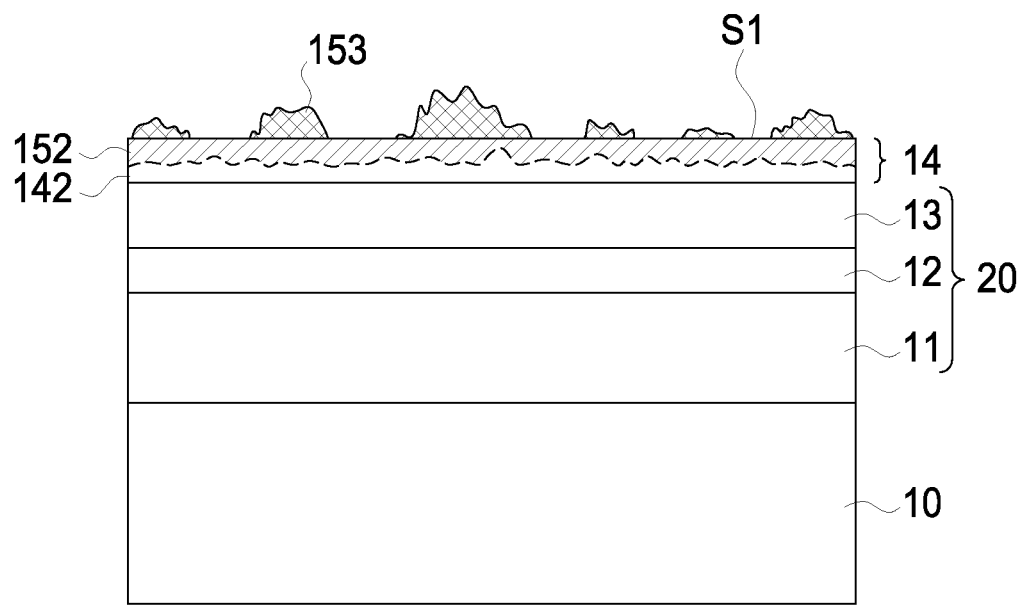
FIG. 2 illustrates a step of a manufacturing method of a light-emitting device in accordance with one embodiment of the present application.

In another example of the first embodiment as shown in FIG. 2, the first metal material of the metal layer 15 is partially diffused into the transparent conductive oxide layer 14 by the heat-treating to form a diffusion region 152, wherein the transparent conductive oxide layer 14 comprises the diffusion region 152 comprising the first metal material and a non-diffusion region 142 substantially not comprising the first metal material. A remaining metal layer 153 with a diminished dimension keeps on the surface S1 of the transparent conductive oxide layer 14. A thickness of the remaining metal layer 153 is preferably less than 100 angstroms to be pervious to the light emitted from the active layer 12. A thickness of the diffusion region 152 is preferably greater than 50 angstroms.

Figure 3A:
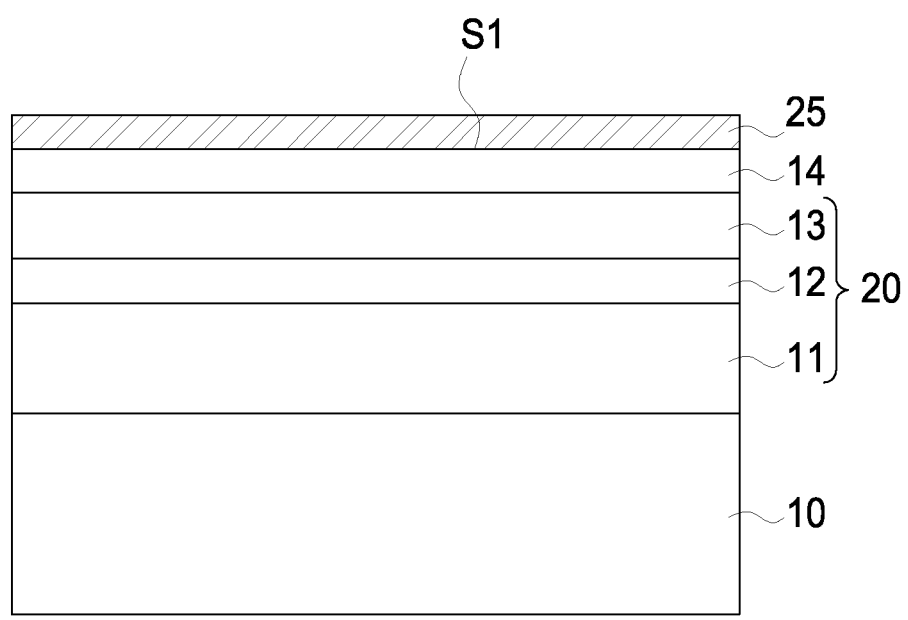
FIGS. 3A-3C illustrate steps of a manufacturing method of a light-emitting device in accordance with one embodiment of the present application.
Figure 3B:
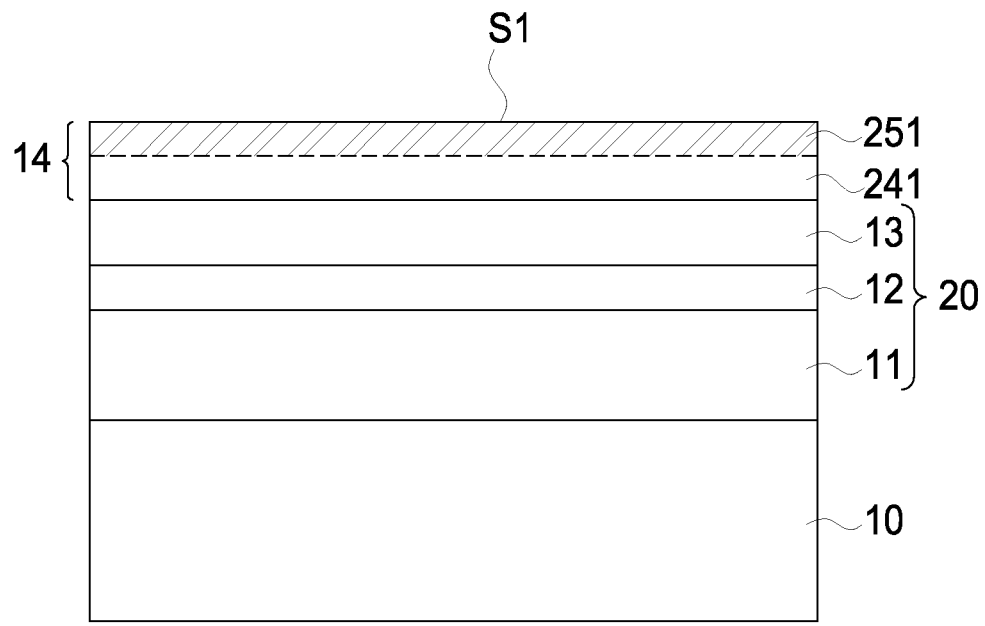
Figure 3C:
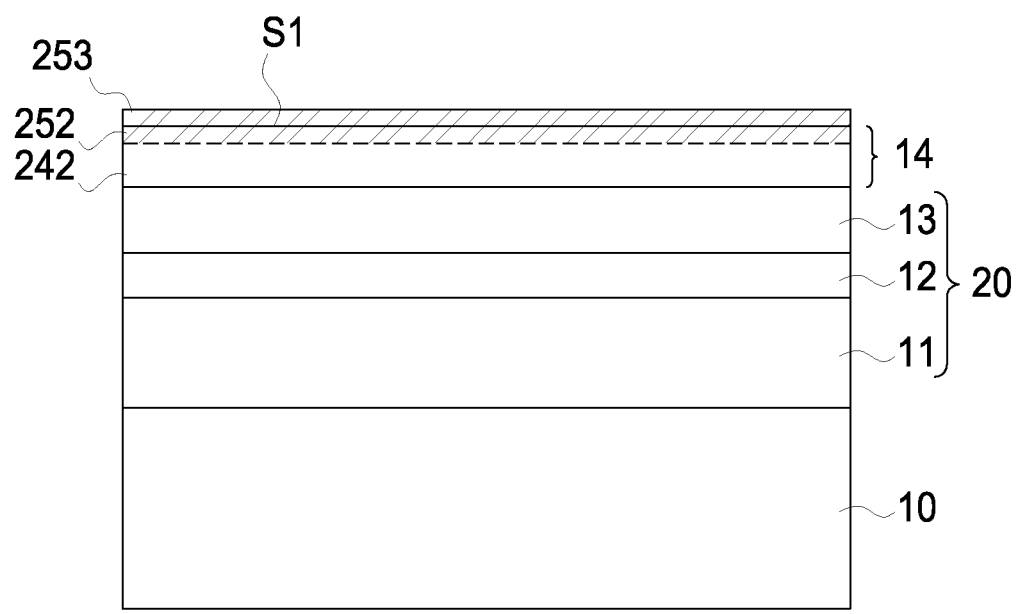

A second embodiment in accordance with the present disclosure is shown in FIGS. 3A-3C. The difference between the first embodiment and the present embodiment is that a metal layer 25 which is analogous to the metal layer 15 of the first embodiment, is a continuous layer with a thickness less than 500 angstroms and is substantially covering the whole surface S1 of the transparent conductive oxide layer 14 before heat-treating. The first metal material of the metal layer 25 is totally diffused into the transparent conductive oxide layer 14 by the heat-treating to form a diffusion region 251, wherein the transparent conductive oxide layer 14 comprises the diffusion region 251 comprising the first metal material and a non-diffusion region 241 substantially not comprising the first metal material as shown in FIG. 3B. In another example of the present embodiment, the first metal material of the metal layer 25 is partially diffused into the transparent conductive oxide layer 14 by the heat-treating to form a diffusion region 252, wherein the transparent conductive oxide layer 14 comprises the diffusion region 252 comprising the first metal material and a non-diffusion region 242 substantially not comprising the first metal material as shown in FIG. 3C. A remaining metal layer 253 with a diminished thickness keeps on the surface S1 of the transparent conductive oxide layer 14. A thickness of the remaining metal layer 253 is preferably less than 100 angstroms to be pervious to the light emitted from the active layer 12, and a thickness of the diffusion region 252 is preferably greater than 50 angstroms.

Figure 4:
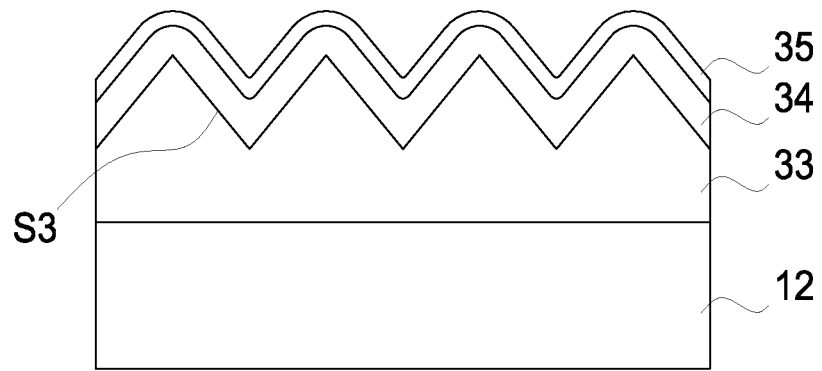
FIG. 4 illustrates an enlarged cross-sectional view of a light-emitting device in accordance with one embodiment of the present application.

FIG. 4 shows a third embodiment in accordance with the present disclosure. The difference between the foregoing embodiments and the present embodiment is that a top surface S3 of a first semiconductor layer 33 is a rough surface, and a transparent conductive oxide layer 34 and a metal layer 35 are conformably formed on the first semiconductor layer 33 before heat-treating.

In the embodiments of the present disclosure, the concentration of the first metal material in the diffusion region is gradually decreased from the top surface of the transparent conductive oxide layer to the inner of the transparent conductive oxide layer, or the concentration of the first metal material in the diffusion region decreases gradually with distance away from the top surface of the transparent conductive oxide layer. During the heat-treating of the transparent conductive oxide layer and the metal layer, the first metal material of the metal layer, such as aluminum, may react with oxygen presented in the transparent conductive oxide layer to form an oxide of the first metal material, such as aluminum oxide. The inert environment of the heat-treating step, such as $N_2$ environment, inactivates and protects the transparent conductive oxide layer 14 from being damaged by the following process, such as ICP etching. In order to prevent the inter-diffusion between the first semiconductor layer and the metal layer from degrading the epitaxial quality of the first semiconductor layer, the metal layer is preferred to be formed on the surface of the transparent conductive oxide layer opposite to the first semiconductor layer in accordance with the present disclosure for a better luminous performance. The light-emitting device of the present disclosure achieves a lower forward voltage, a lower sheet resistance, and higher light extraction efficiency.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a first semiconductor layer;
a second semiconductor layer;
an active layer formed between the first semiconductor layer and the second semiconductor layer;
a transparent conductive oxide layer comprising one or more elements formed on the second semiconductor layer;
a plurality of metal sediments formed on the transparent conductive oxide layer, wherein the plurality of metal sediments comprises a metal different from the one or more elements, and the plurality of metal sediments is transmissive to a light emitted from the active layer, wherein the plurality of metal sediments comprises different thickness; and
a diffusion region comprising the metal of the plurality of metal sediments formed in the transparent conductive oxide layer.

2. The light-emitting device of claim 1, wherein a thickness of the diffusion region is greater than 50 angstroms.

3. The light-emitting device of claim 1, wherein a concentration of the metal in the diffusion region decreases gradually toward the first semiconductor layer.

4. The light-emitting device of claim 1, wherein the metal comprises an element selected from a group consisting of IIA group or IIIA group of periodic table.

5. The light-emitting device of claim 1, further comprising an oxide of the metal formed in the transparent conductive oxide layer.

6. The light-emitting device of claim 1, wherein the plurality of metal sediments comprises a thickness less than 100 angstroms.

* * * * *